(12) United States Patent
Katayama et al.

(10) Patent No.: US 8,902,694 B2
(45) Date of Patent: Dec. 2, 2014

(54) INTEGRITY CHECK OF MEASURED SIGNAL TRACE DATA

(71) Applicant: International Business Machines Corporation, Armonk, NY (US)

(72) Inventors: Yasunao Katayama, Kawasaki (JP); Seiji Munetoh, Kawasaki (JP); Nobuyuki Ohba, Sendai (JP); Tadayuki Okada, Tokyo (JP); Atsuya Okazaki, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/013,348

(22) Filed: Aug. 29, 2013

(65) Prior Publication Data

US 2014/0071785 A1    Mar. 13, 2014

(30) Foreign Application Priority Data

Sep. 12, 2012  (JP) ................................. 2012-200304

(51) Int. Cl.
*G11C 7/00*     (2006.01)
*G06F 11/07*    (2006.01)
*G11C 8/18*     (2006.01)
*G06F 11/30*    (2006.01)

(52) U.S. Cl.
CPC ................ *G11C 8/18* (2013.01); *G06F 11/076* (2013.01); *G06F 11/30* (2013.01); *G06F 11/073* (2013.01)
USPC ...................................... 365/233.13; 714/708

(58) Field of Classification Search
USPC .............................. 365/233.13, 193; 714/708
See application file for complete search history.

(56) References Cited

U.S. PATENT DOCUMENTS 7,266,632 B2 *  9/2007  Dao et al. ...................... 710/317
7,493,531 B2 *  2/2009  Ito et al. ........................ 714/708

FOREIGN PATENT DOCUMENTS

| JP | 2002229814 A | 8/2002 |
| JP | 2003150403 A | 5/2003 |
| JP | 2011059953 A | 3/2011 |
| WO | 02063473 A1 | 8/2002 |

* cited by examiner

*Primary Examiner* — Michael Tran
(74) *Attorney, Agent, or Firm* — Cantor Colburn LLP; Gail Zarick

(57) ABSTRACT

A method of monitoring signals is disclosed, wherein a plurality of command signals and address signals are consecutively expressed, as a measurement target. The method includes setting a strobe timing that has a predetermined initial value; calculating an error rate by monitoring the plurality of command signals, in accordance with the strobe timing; monitoring the plurality of address signals, and calculating a burst rate from a difference between the consecutive plurality of address signals, in accordance with the strobe timing; identifying timing where the calculated error rate and calculated burst rate are both optimized; and in the event the timing where both the calculated error rate and calculated burst rate are optimized cannot be identified, altering a predetermined value of the set strobe timing, and repeating the calculating, monitoring, and identifying.

10 Claims, 5 Drawing Sheets addr = addr$\eta_{ast}$ + cache line size

INTEGRITY CHECK OF MEASURED SIGNAL TRACE DATA

PRIORITY

This application claims priority to Japanese Patent Application No. 2012-200304, filed 12 Sep. 2012, and all the benefits accruing therefrom under 35 U.S.C. §119, the contents of which in its entirety are herein incorporated by reference.

BACKGROUND

The present invention relates to a mechanism that ensures the accuracy of measurement data of a signal. More specifically, the present invention relates to performing calibration of trace data that records access to memory.

Trace data (command signal, address signal) of actual access to main memory (DDR DRAM) of the computer can be acquired by using a specialized hardware. DDR DRAM (Double-Data-Rate Dynamic Random Access Memory) is sometimes referred to as DDR SDRAM (Double-Data-Rate Synchronous Dynamic Random Access Memory). DDR DRAM is a type of standard for DRAM including a semiconductor integrated circuit that is used in personal computers.

With DDR DRAM, data is transferred at the rising edge and falling edge of the clock signal, and theoretically, a double data transfer rate is achieved as compared to SDRAM that operates synchronous to the clock. For normal signal integrity checks, calibration is performed by comparing the actual measurement value using a given value such as a test pattern and the like, and an anticipated value. With DDR DRAM, periodic calibration is performed at system startup for the data signal, but calibration is not performed at all for the command signal and the address signal.

Tracing is performed by monitoring a signal line (using FPGA and the like) for the command and address of the measurement target, but if the measurement target is high speed (synchronization at the nanosecond level is required), fine adjustment of strobe timing must be performed or accurate measurement data cannot be obtained. With a trace that uses snoop on the signal line, if calibration is performed by the acquired signal, the calibration operation of the measurement target can also be used for the calibration of the tracer, but adaption of this technique is difficult for the command signal and the address signal of DDR DRAM.

Because there is no technique that calibrates the command signal and the address signal of the DDR memory described above, a mechanism that ensures the accuracy of the measurement data of the tracer is necessary. As a software technique, a specific access pattern is generated in a specific physical address from a CPU, and verification is possible by comparing the measurement data, however several problems exist.

From the fact that concealing access by cache and identification of exact time is difficult, one-to-one correspondence of memory access by SW on the CPU and actual memory access is difficult. Also, with a general purpose OS that uses a virtual address, access to a specific physical address cannot be generated. Synchronization of SW and HW at a high speed nanosecond level is difficult, and detection of verification data from the large amount of trace data is necessary.

With conventional technology that uses a hardware device, a waveform of the DRAM signal can be visualized by sweeping trigger timing and threshold voltage using a logic analyzer. Based on looking at the waveform diagram, fine adjustment of the strobe timing is possible. The logic analyzer displays a signal on a digital circuital that is too fast to be observed by humans. The logic analyzer can only examine the transition timing of the signal, and the measurement value must be examined by a separate protocol analyzer.

However, although existing products that use a logic analyzer as a base are expensive, the amount of data that can be traced is small, and use for long term measurement is not possible. On the other hand, if FPGA is used, a measurement device that is comparatively inexpensive can be implemented, but achieving reliability of a measurement signal similar to that of a logic analyzer that uses a dedicated circuit is difficult. There is demand for a tracer that can ensure reliability of measurement data obtained in large amounts, has general purpose properties, is inexpensive, and has scalability.

International Patent Publication WO2002/063473, Japanese Unexamined Patent Application 2002-229814, and Japanese Unexamined Patent Application 2003-150403 disclose that a required logic function is achieved using FPGA, and a system such as a CPU bus and the like is evaluated (calibrated) using the logic function. Japanese Unexamined Patent Application 2011-59953 discloses a device that verifies logic of the memory controller. However, none of the foregoing publications relate to calibration techniques for a bus that uses the various properties that are a part of memory bus and CPU bus protocol.

SUMMARY

In one embodiment, a method of monitoring signals is disclosed, wherein a plurality of command signals and address signals are consecutively expressed, as a measurement target. The method includes setting a strobe timing that has a predetermined initial value; calculating an error rate by monitoring the plurality of command signals, in accordance with the strobe timing; monitoring the plurality of address signals, and calculating a burst rate from a difference between the consecutive plurality of address signals, in accordance with the strobe timing; identifying timing where the calculated error rate and calculated burst rate are both optimized; and in the event the timing where both the calculated error rate and calculated burst rate are optimized cannot be identified, altering a predetermined value of the set strobe timing, and repeating the calculating, monitoring, and identifying.

In another embodiment, a device that monitors a signal as a measurement target, where a plurality of command signals and address signals are consecutively expressed, includes: a dynamic checker that calculates an error rate using the monitored plurality of command signals as input, and that calculates a burst rate from the difference between the consecutive plurality of address signals using the monitored plurality of address signals as input; an MCU that identifies whether or not the calculated error rate and calculated burst rate are at optimized timing using both rates as inputs; and a delay adjuster that, in the event timing where both rates are optimized cannot be identified, alters the predetermined value of the set strobe timing, and provides a new input into the dynamic checker.

In another embodiment, a method of monitoring a signal as a measurement target, where a plurality of command signals and address signals are consecutively expressed includes setting a strobe timing that has a predetermined initial value; calculating an error rate and a burst rate by monitoring a plurality of command signals and a plurality of address signals, in accordance with the strobe timing; identifying timing where the calculated error rate and calculated burst rate are both optimized as a target; and in the event the timing where both rates are optimized cannot be identified, sweeping a predetermined value of the set strobe timing, and repeating the setting, calculating and identifying.

DETAILED DESCRIPTION

An object of the present invention is to perform calibration of trace data that records access to memory without depending on the measurement target.

Performing calibration on the tracer side is preferable without requiring special modifications on the measurement target host side. By monitoring (snooping) the command signal and address signal to the DDR memory, trace data (command signal, address signal) for access to DIMM is acquired. The acquired data is recorded as is into external storage device(s). An input signal is verified by a dynamic checker, and the monitored individual input timing is adjusted so as to eliminate errors.

Specifically, adjustment is performed by using calibration that is divided into command verification by a finite state machine (technique 1) and address verification by a statistical value of burst access (technique 2). (1) Dynamic calibration during measurement and static (offline) verification based on the measurement results are possible. (2) Implementation is possible in FPGA. (3) Verification of the acquired timing and value of the signal is possible.

Figure 1:
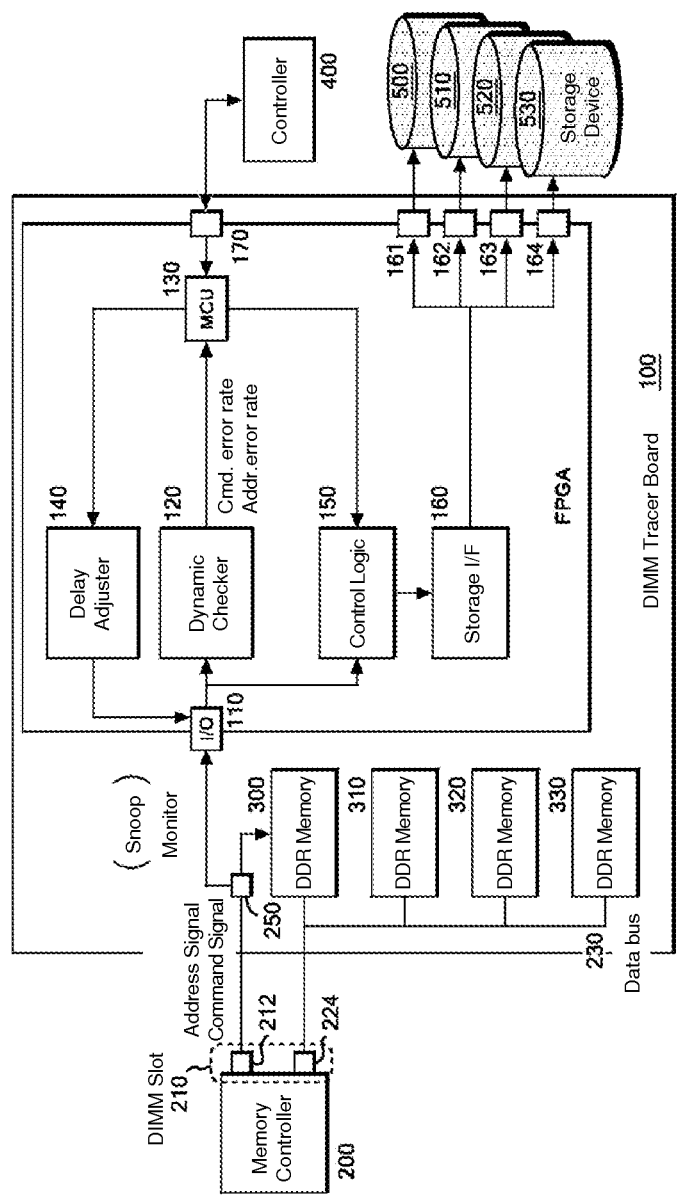
FIG. 1 is an overall block diagram illustrating the relationship between a tracer where dynamic calibration is implemented during measurement, and an object that is connected thereto, according to the present invention.

FIG. 1 is an overall block diagram illustrating the relationship between a tracer where dynamic calibration is implemented during measurement, and an object that is connected thereto, according to the present invention.

FPGA is installed in a DIMM tracer board 100. The FPGA (Field-Programmable Gate Array) is an integrated circuit where a purchaser or designer can set the configuration after production, and in a wider sense is a type of PLD (Programmable Logic Device). This name is used because the array is a field-programmable (programmable in the field) gate array. The characteristic improvisation of the present invention can be used even with a FPGA.

An address signal and command signal 212 as well as a data signal 214 are provided in a DIMM slot 210. Data is written or data is read via a data bus 230 to DDR memory 300, 310, 320, and 330 from a DIMM slot 224. An address signal and command signal for controlling data write or data read are generated from the DIMM slot 212. Therefore, a plurality of command signals and address signals consecutively expressed at measurement point 250.

In the present invention, this type of signal is monitored (snooped) as a measurement target, but if the measurement target is high speed (synchronization is required at the nanosecond level), fine adjustment of the strobe timing must be performed or accurate measurement data cannot be obtained. The monitored (snooped) signal becomes an input to the tracer (device) from I/O 110. The dynamic checker 120 calculates the error rate (such as counting commands that cause improper transitions and the like) using the monitored plurality of command signals as input, and calculates a burst rate from the relationship (difference) between the consecutive plurality of address signals using the monitored plurality of address signals as input, in accordance with strobe timing with a predetermined (initial) value.

A micro control unit MCU 130 controls the entire tracer. The MCU 130 inputs the calculated error rate and calculated burst rate and determines whether or not both rates are at optimized timing. If the timing where both rates are optimized cannot be determined, a delay adjuster 140 alters (increases or decreases) the predetermined value of the set strobe timing, and inputs new feedback to the dynamic checker 120 through the I/O 110. This type of delay adjustment can be performed automatically by the MCU, or can be performed by an external controller 400, as described later. This value can be used later by saving the setting information of the delay adjustment. For example, the value can be used as "strobe timing with a predetermined (initial) value." Thereby, during on-the-fly examination by HW, an error count can be dynamically acquired, so automatic adjustment of various parameters is possible while performing a command trace of the DDR memory.

In the FPGA, the MCU 130 guides the (snooped) monitored signal to a storage I/F 160 by using control logic 150 in a process parallel to the foregoing. The storage I/F 160 records the obtained data as is in external storage device(s) and records to external storage devices 500, 510, 520, and 530 through output points 161, 162, 163, and 164. The tracer (device) or tracer board includes the storage devices 500, 510, 520, and 530 as recording devices that record the traced data. The external controller 400 can also control the MCU 130 through a point 170. A general purpose interface (IF) such as an RS-232c or the like can be used at point 170.

In this case, the MCU 130 can perform measurements based on a command provided from the external controller 400. The MCU 130 can also notify the external controller 400 of the internal state. The tracer (device) or tracer board can also include the controller 400 that controls the tracer.

Figure 2:
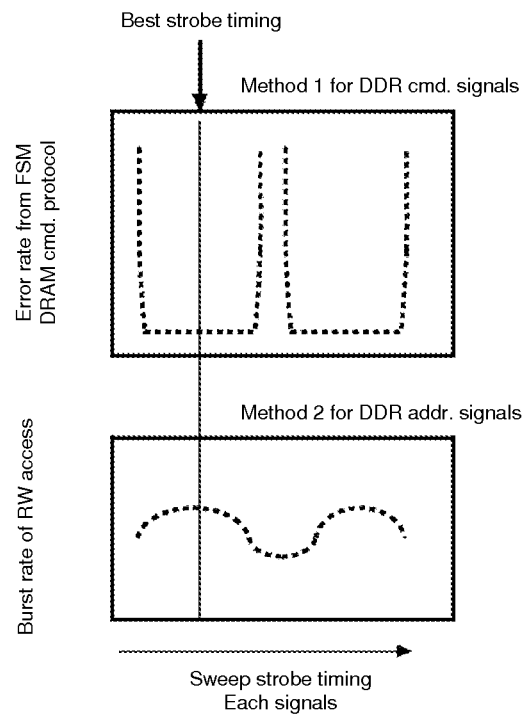
FIGS. 2A and 2B is a pattern diagram describing locations for best strobe timing for a waveform that is acquired for an error rate and for a waveform that is acquired for a burst rate, according to the present invention.

FIG. 2 is a pattern diagram describing locations for best strobe timing for a waveform that is acquired for an error rate and for a waveform that is acquired for a burst rate, according to the present invention.

With the method of the present invention, the signal that consecutively expresses the plurality of command signals and address signals is monitored (snooped) as a measurement target. First, strobe timing is set to a predetermined (initial) value, using for example, the setting information of the stored delay adjustment.

As illustrated in (A) of FIG. 2, the error rate is calculated by monitoring the plurality of command signals, in accordance with the strobe timing. A technique can be used that calculates the error rate by counts commands that cause improper transitions. The vertical axis of the graph in (A) of FIG. 2 is an error rate from the FSM (finite state machine), and is a rate that follows DRAM command protocol. As illustrated in (B) of FIG. 2, the burst rate is calculated from the relationship of the plurality of consecutive address signals by monitoring the plurality of address signals, in accordance with the strobe timing. Typically, the relationship between the plurality of consecutive address signals is the difference between consecutive address signals. However, one skilled in the art can conceive of a separate relationship. The timing where the calculated error rate and the calculated burst rate are both optimized is identified. The timing where both rates are optimized corresponds to the area that is indicated by the arrow as "best strobe timing."

In (A) of FIG. 2, the determination of whether or not the error rate is optimized is made using a bathtub curve (dotted line) with the strobe timing value on the lateral axis, by determining if the error rate is smaller (minimized) inside (preferably at the center of) the bathtub curve. Simply minimizing command error is not sufficient, and in most cases, error must be eliminated to zero. However, the technical concept of the present invention can widely apply even to cases where the error rate is permitted to be below a predetermined threshold value.

In (B) of FIG. 2, the determination of whether or not the burst rate is optimized is made using a curve (dotted line) with the strobe timing value on the lateral axis, by determining if the burst rate is larger (maximized) inside (preferably at the center) of the curve. Maximization is not always required as a standard for determination, and the technical concept of the present invention can widely apply even to cases where the burst rate is controlled to be below a predetermined threshold value. In this manner, strobe timing of each signal line is adjusted using calibration that is divided into command verification by a finite state machine according to (A) of FIG. 2 (technique 1), and address verification by a statistical value of burst access according to (B) of FIG. 2 (technique 2). If the technical concept of the present invention is generalized, the measurement data can be widely applied to evaluation by using a DDR command finite state machine and local properties and statistical properties of memory access.

Figure 3:
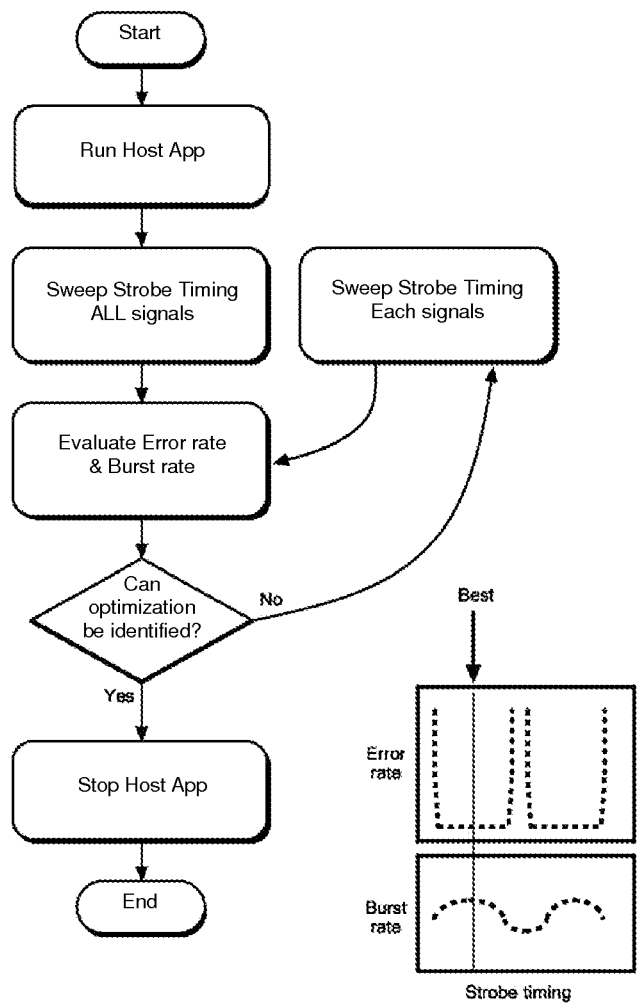
FIG. 3 is a flow chart for adjusting timing that implements the present invention.

FIG. 3 is a flow chart for adjusting timing that implements embodiments of the present invention. To start, an application is executed for a measurement target host (refer to FIG. 5). This execution can be benchmarking or the like. Statistical calibration of trace data is possible by comparing statistical information between a given application and a benchmark trace. Next, (a) strobe timing is set to a predetermined (initial) value. In other words, the strobe timing is swept for all signals (command signals, address signals). Next, (b) the error rate (such as counting commands that cause improper transitions) is calculated by monitoring the plurality of command signals, in accordance with the strobe timing. Next, (c) the burst rate is calculated from the relationship (difference) between consecutive address signals by monitoring the plurality of address signals, in accordance with the strobe timing.

However, (b) and (c) can be processed parallel, or in a sequence where (c) comes before (b), as long as timing adjustment is possible. Next, (d) the timing where the calculated error rate and the calculated burst rate are both optimized is identified. In other words, determination is made as to whether or not optimization can be identified. Specifically, as described above, the values should fall within the range of the predetermined threshold. Next, (e) if the timing where both rates are optimized cannot be identified, the predetermined value of the set strobe timing is altered (increased and decreased). In other words, the strobe timing is swept. This corresponds to the shifting to the left or right on the lateral axis of the graph in (A) of FIG. 2 and (B) of FIG. 2.

If appropriate timing by simultaneous sweeping that is performed for all signals (command signals, address signals) is not identified, determining optimum timing can be performed by separately sweeping the strobe timing for the individual signals; only command signals, and only address signals. After the strobe timing is swept, the plurality of processes (b), (c), and (d) are repeated. By processing in this manner, accurate measurement data can be achieved by performing fine adjustment of the strobe timing.

When measurement is complete, the application of the measurement target host (refer to FIG. 5) is stopped.

Figure 4:
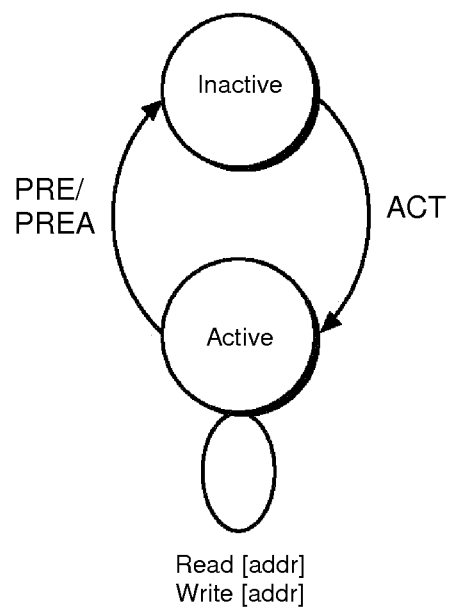
FIG. 4 is a diagram illustrating a finite state machine (FSM) and address checking of burst access when implementing the present invention.

FIG. 4 is a diagram illustrating a finite state machine (FSM) and address checking of burst access when implementing the present invention. The error rate can be determined by tracing the DDR memory command signal using the finite state machine (FSM) illustrated in the diagram, and counting the total number of commands that cause improper transitions as errors. The DDR memory has eight banks, and a finite state machine (FSM) as illustrated in the diagram can be allocated to each bank. Furthermore, the address signals of the DDR memory are recorded, and the difference between consecutive address signals can determine the frequency (burst rate), which is the cache line size (=burst access).

Based on this relationship, even if access by cache is concealed, or if identification of the exact time is difficult, a one-to-one correspondence of memory access by SW on the CPU and actual memory access is possible. Thereby, adjustment of all address signals and command signals is possible. The characteristic of a simple calculation makes possible implementation by HW, and also enables dynamic calibration and automatic calibration. Furthermore, access on a specific physical address can be generated even with a general purpose OS that uses a virtual address.

Figure 5:
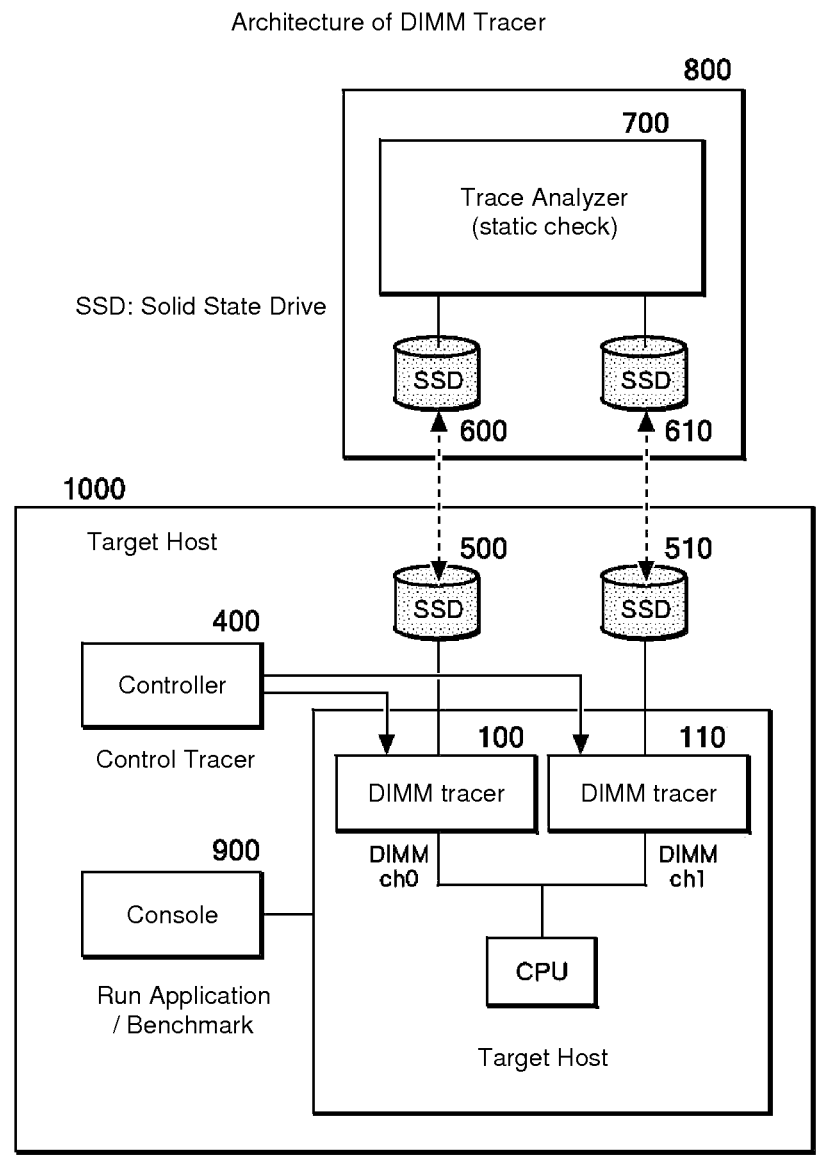
FIG. 5 is an overall block diagram demonstrating that dynamic calibration during measurement and static (offline) verification based on measurement results are possible by using the tracer of the present invention.

FIG. 5 is an overall block diagram demonstrating that dynamic calibration during measurement and static verification based on measurement results are possible by using the tracer of the present invention. Dynamic calibration during measurement can be implemented in the DIMM tracer 100 and DIMM tracer 110. The trace (device) or tracer board can also be configured to include a console 900. Furthermore, the acquired data can be recorded as is into a SSD 500 and SSD 510, which are storage device(s) in the target host 1000. Direct recording into a SSD 600 and SSD 610, which are storage device(s) outside the target host 1000, is also possible.

Alternately, the data that is recorded in the SSD 500 and SSD 510, which are storage device(s) in the target host 1000, can be transferred to the SSD 600 and SSD 610, which are storage device(s) outside the target host 1000. Based on the measurement results, static calibration is even possible ex post facto by using a trace analyzer 700 located in the SSD 800 outside of the target host 1000.

With static calibration, verification is possible using statistical properties of a large amount of data. The technique of the present invention is described above while exemplifying the DIMM trace and FPGA, but the technical concept of the present invention can be widely applied to cases with similar measurement target properties other than DIMM trace and FPGA.

The invention claimed is:
1. A method of monitoring signals, wherein a plurality of command signals and address signals are consecutively expressed, as a measurement target, the method comprising:
setting a strobe timing that has a predetermined initial value;
calculating an error rate by monitoring the plurality of command signals, in accordance with the strobe timing;
monitoring the plurality of address signals, and calculating a burst rate from a difference between the consecutive plurality of address signals, in accordance with the strobe timing;

identifying timing where the calculated error rate and calculated burst rate are both optimized; and in the event the timing where both the calculated error rate and calculated burst rate are optimized cannot be identified, altering a predetermined value of the set strobe timing, and repeating the calculating, monitoring, and identifying.

2. The method according to claim 1, wherein the determination of whether or not the error rate is optimized is made using a bathtub curve with the strobe timing value on the lateral axis, by determining whether the error rate is minimized at a center of the bathtub curve.

3. The method according to claim 1, wherein the determination of whether or not the burst rate is optimized is made using a curve with the strobe timing value on the lateral axis, by determining whether the burst rate is maximized at a center of the curve.

4. The method according to claim 1, wherein a signal expressed by dividing the plurality of command signals and plurality of address signals that are monitored as the measurement target, is a pattern of a signal that a CPU of a computer has accessed a main memory of the computer.

5. The method according to claim 1, wherein the signal that is the measurement target is to be synchronized and calibrated at the nanosecond level.

6. A method of monitoring a signal as a measurement target, where a plurality of command signals and address signals are consecutively expressed, the method comprising:

setting a strobe timing that has a predetermined initial value;

calculating an error rate and a burst rate by monitoring a plurality of command signals and a plurality of address signals, in accordance with the strobe timing;

identifying timing where the calculated error rate and calculated burst rate are both optimized as a target; and in the event the timing where both rates are optimized cannot be identified, sweeping a predetermined value of the set strobe timing, and repeating the setting, calculating and identifying.

7. The method according to claim 6, wherein the determination of whether or not the error rate is optimized is made using a bathtub curve with the strobe timing value on the lateral axis, by determining whether the error rate is minimized at a center of the bathtub curve.

8. The method according to claim 6, wherein the determination of whether or not the burst rate is optimized is made using a curve with the strobe timing value on the lateral axis, by determining whether the burst rate is maximized at a center of the curve.

9. The method according to claim 6, wherein a signal expressed by dividing the plurality of command signals and plurality of address signals that are monitored as the measurement target, is a pattern of a signal that a CPU of a computer has accessed a main memory of the computer.

10. The method according to claim 6, wherein the signal that is the measurement target is to be synchronized and calibrated at the nanosecond level.

* * * * *